United States Patent
Dabral et al.

(10) Patent No.: US 10,566,286 B2
(45) Date of Patent: Feb. 18, 2020

(54) HIGH BANDWIDTH ROUTING FOR DIE TO DIE INTERPOSER AND ON-CHIP APPLICATIONS

(71) Applicant: Apple Inc., Cupertino, CA (US)

(72) Inventors: Sanjay Dabral, Cupertino, CA (US); David A. Secker, San Jose, CA (US); Huabo Chen, Saratoga, CA (US); Zhenggang Cheng, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/250,854

(22) Filed: Jan. 17, 2019

(65) Prior Publication Data

US 2019/0189560 A1    Jun. 20, 2019

Related U.S. Application Data

(62) Division of application No. 15/845,978, filed on Dec. 18, 2017, now Pat. No. 10,217,708.

(51) Int. Cl.

| | |
|---|---|
| *H01L 23/52* | (2006.01) |
| *H01L 23/538* | (2006.01) |
| *H01L 23/498* | (2006.01) |
| *H01L 23/14* | (2006.01) |
| *H01L 23/00* | (2006.01) |
| *H01L 25/065* | (2006.01) |

(52) U.S. Cl.
CPC ........ *H01L 23/5381* (2013.01); *H01L 23/147* (2013.01); *H01L 23/49811* (2013.01); *H01L 23/5383* (2013.01); *H01L 23/5386* (2013.01); *H01L 24/16* (2013.01); *H01L 24/17* (2013.01); *H01L 25/0655* (2013.01); *H01L 2224/16227* (2013.01); *H01L 2224/1703* (2013.01); *H01L 2924/19041* (2013.01)

(58) Field of Classification Search
CPC ... H05K 1/03; H05K 1/11; H05K 1/16; H05K 3/00; H05K 3/46; H01Q 1/22; H01Q 1/42; H01L 23/52; H01L 23/538
USPC ......... 174/260, 250, 255, 262, 264; 361/794
See application file for complete search history.

(56) References Cited

U.S. PATENT DOCUMENTS

| | | | | |
|---|---|---|---|---|
| 4,980,034 | A * | 12/1990 | Volfson | H01L 23/5383 205/122 |
| 5,072,075 | A * | 12/1991 | Lee | H05K 1/162 174/255 |
| 6,246,112 | B1 * | 6/2001 | Ball | H01L 23/49822 257/690 |
| 8,704,384 | B2 | 4/2014 | Wu et al. | |

(Continued)

OTHER PUBLICATIONS

K. Chandrasekar, D. Oh and A. Rahman, "Timing analysis for wide IO memory interface applications with silicon interposer," 2014 IEEE International Symposium on Electromagnetic Compatibility (EMC), Raleigh, NC, 2014, pp. 46-51.

(Continued)

*Primary Examiner* — Xiaoliang Chen
(74) *Attorney, Agent, or Firm* — Jaffery Watson Mendonsa & Hamilton LLP

(57) ABSTRACT

Routing structures including signal routing between die areas is described. In an embodiment, routing structures include signal lines with a characteristic thickness that is greater than a width. The signal lines may be twisted, and run directly underneath pads.

20 Claims, 9 Drawing Sheets

(56) References Cited

U.S. PATENT DOCUMENTS

| | | | |
|---|---|---|---|
| 8,791,371 B2 * | 7/2014 | Choi | H01L 23/49822 174/262 |
| 8,901,747 B2 | 12/2014 | Miller et al. | |
| 8,946,890 B2 | 2/2015 | Sutardja et al. | |
| 9,144,150 B2 | 9/2015 | Wu | |
| 9,147,663 B2 | 9/2015 | Liu et al. | |
| 9,177,926 B2 | 11/2015 | Scanlan et al. | |
| 9,559,081 B1 * | 1/2017 | Lai | H01L 25/0657 |
| 9,985,346 B2 * | 5/2018 | Baks | H01L 23/49827 |
| 10,091,873 B1 * | 10/2018 | Xiong | H05K 1/0298 |
| 2004/0012938 A1 * | 1/2004 | Sylvester | H01L 21/4857 361/794 |
| 2007/0176613 A1 | 8/2007 | Ogawa et al. | |
| 2010/0307798 A1 * | 12/2010 | Izadian | H01L 24/24 174/255 |
| 2011/0061898 A1 * | 3/2011 | Mutnury | G06F 17/5036 174/250 |
| 2016/0049723 A1 * | 2/2016 | Baks | H01L 23/49827 343/848 |
| 2017/0125895 A1 * | 5/2017 | Baks | H01L 23/49827 |
| 2018/0159203 A1 * | 6/2018 | Baks | H01Q 1/2283 |

OTHER PUBLICATIONS

A. Wong, G. Tsui, B. Soo, C. Khoo and Y. Wang, "High bandwidth low power interposer interconnect challenge, design, and validation in 3D silicon stacked interconnect (SSI) technology," 2016 IEEE International Symposium on Electromagnetic Compatibility (EMC), Ottawa, ON, 2016, pp. 434-439.

* cited by examiner

*FIG. 3A*
*FIG. 3B*
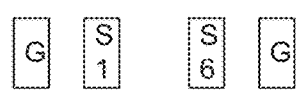
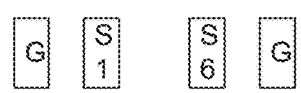
*FIG. 3C*
*FIG. 3D*
*FIG. 3E*
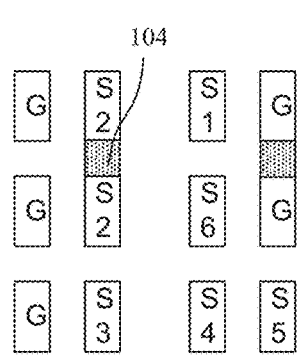
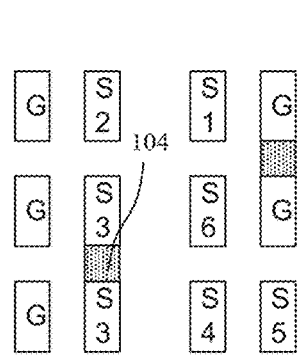
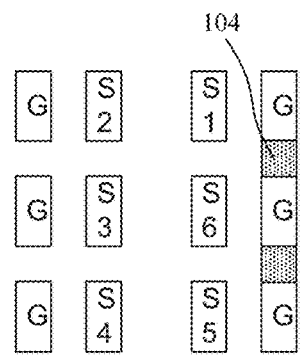
*FIG. 3F*
*FIG. 3G*
*FIG. 3H*

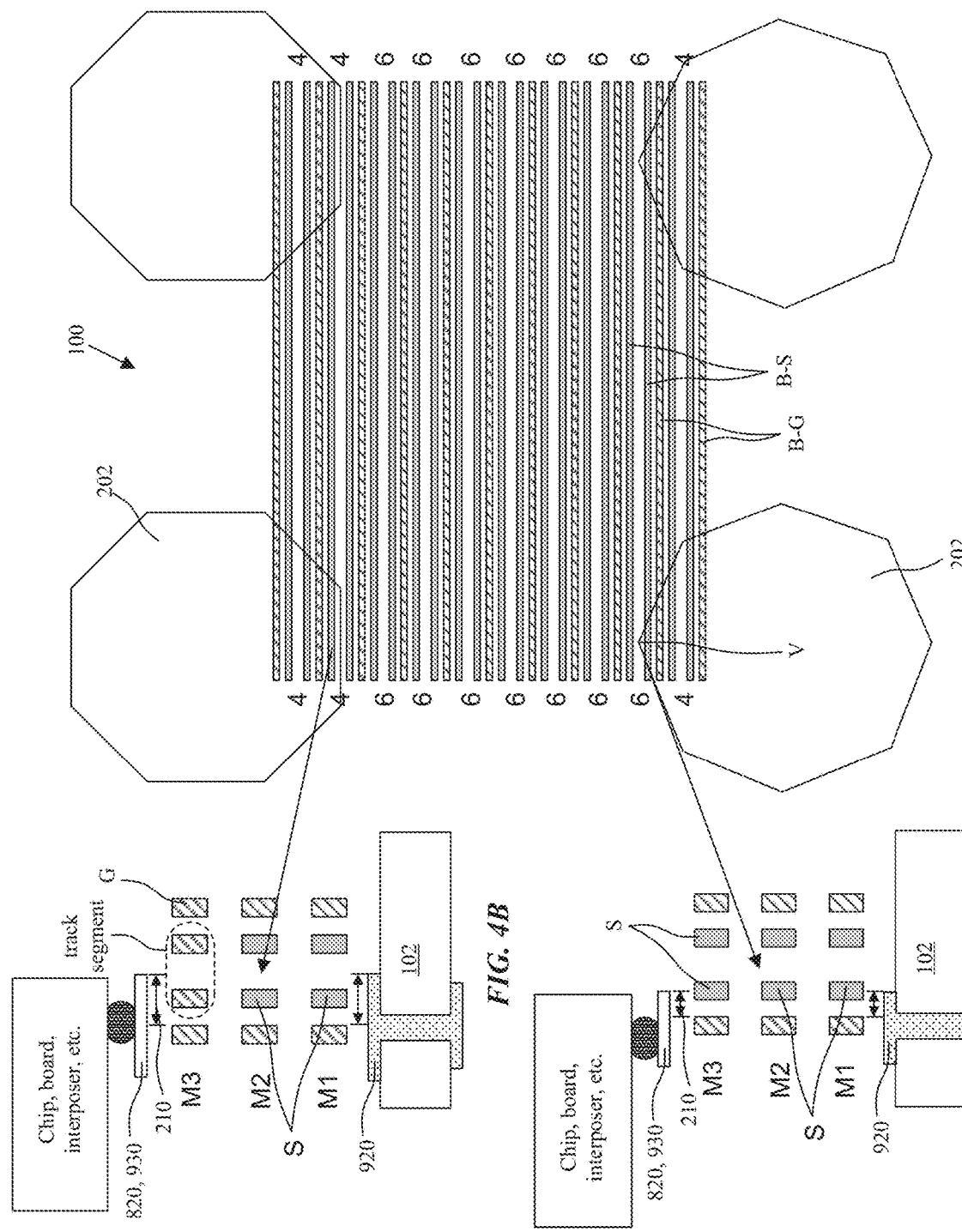

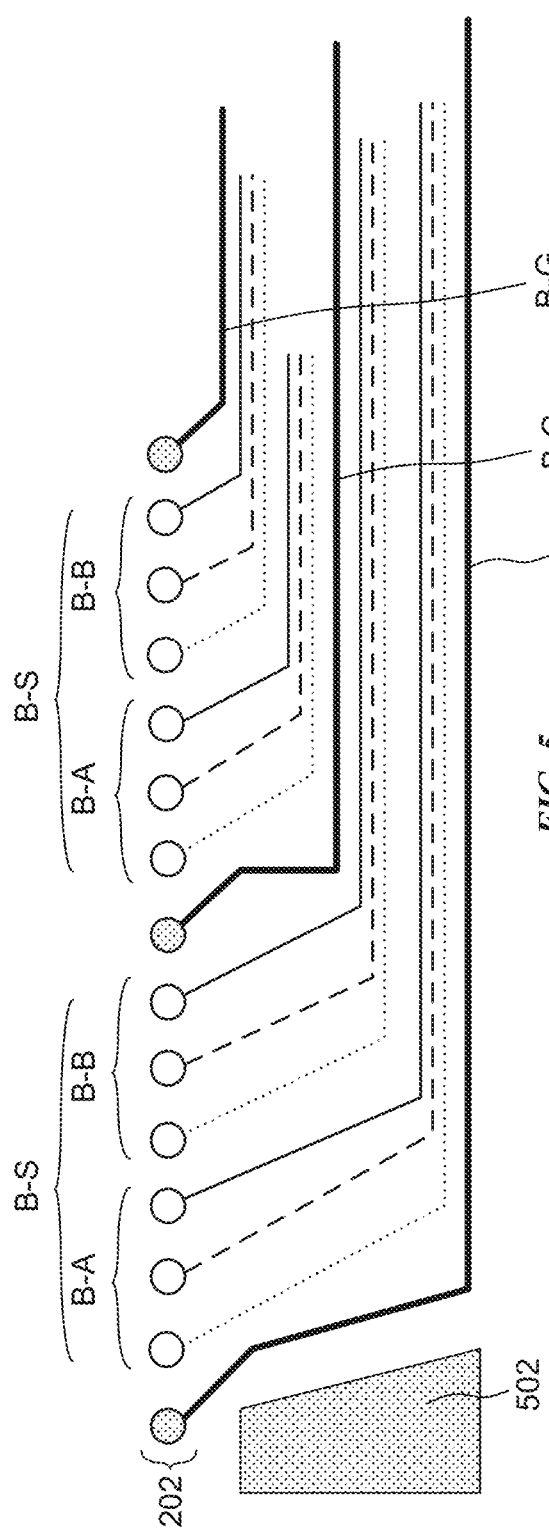
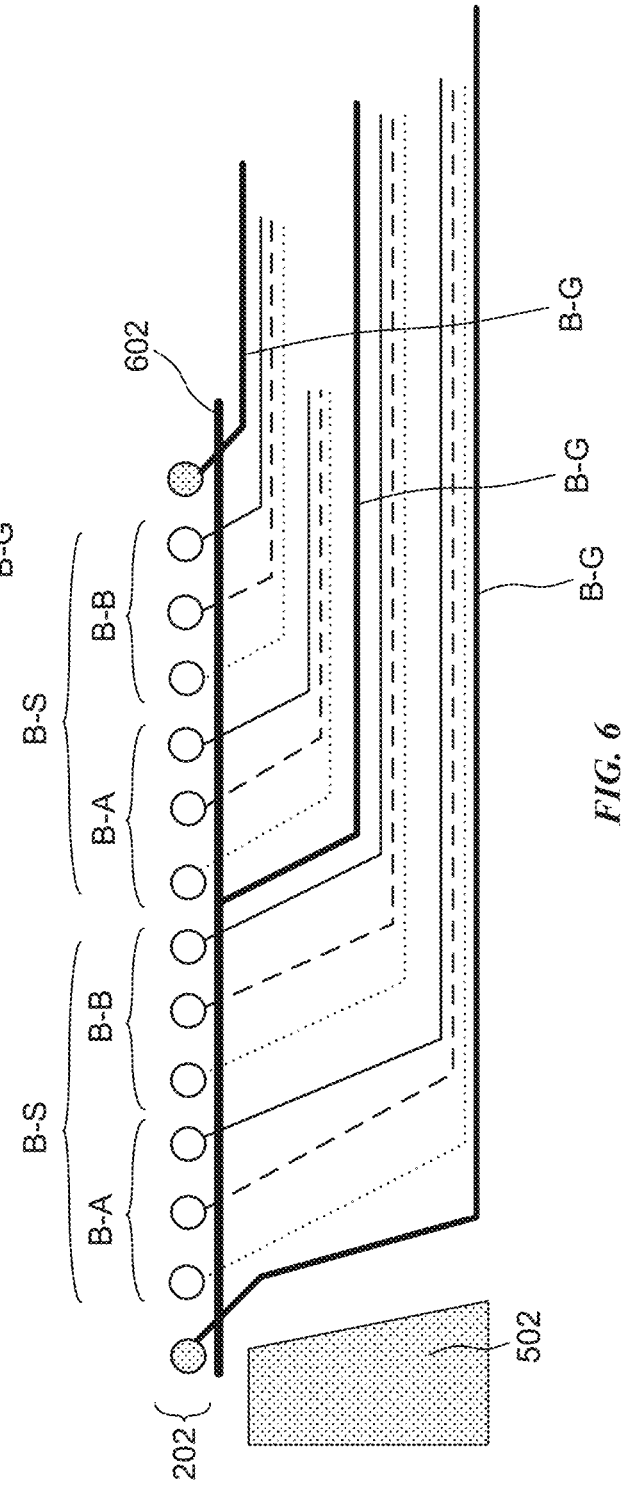
FIG. 5
FIG. 6

HIGH BANDWIDTH ROUTING FOR DIE TO DIE INTERPOSER AND ON-CHIP APPLICATIONS

RELATED APPLICATIONS

This application is a divisional of co-pending U.S. patent application Ser. No. 15/845,978 filed Dec. 18, 2017, which is incorporated herein by reference.

BACKGROUND

Field

Embodiments described herein relate to integrated circuit (IC) manufacture, and the interconnection of multiple die areas.

Background Information

Multi-die packaging solutions commonly connect adjacent dies within a single package. For example, various 2D, 2.5D and 3D packaging solutions in particular have been proposed as multi-die packaging solutions to connect adjacent dies within a single package. In a 2.5D package a silicon interposer is commonly utilized to connect the edges of two dies. More recently silicon bridges have been proposed as an alternative solution to connect the edges of two dies. As computing needs increase, higher bandwidth communication between adjacent dies is required to enable higher performance. Additionally, there may be a demand for higher performance within smaller dimensions, requiring higher density structures.

SUMMARY

Embodiments describe routing structures including signal routing that connects die areas. The signal routing may be used to connect on-chip and off-chip die areas in accordance with embodiments. In some embodiments, the signal routing may include twisted signal lines. Such a routing structure may include a first die area, a second die area, and a signal routing connecting the first die area and the second die area. The signal routing may include a first group of stacked reference lines in a corresponding plurality of metal layers, a second group of stacked reference lines in the corresponding plurality of metal layers, a group of stacked trace lines horizontally between the first and second groups of stacked reference lines in the corresponding plurality of metal layers, and a plurality of inter-layer switch regions and intra-layer switch regions interconnecting the group of stacked trace lines to form a bundle of twisted signal lines with corresponding signal paths that periodically change between the plurality of metal layers.

In an embodiment, the signal lines may be located adjacent rotated pads. In such a configuration, the signal routing may include a plurality of stacked reference lines extending between the first die area and the second die area, and a signal line bundle extending between the first die area and the second die area. One or more pads may be located directly over the stacked signal line bundle, where the one or more pads have a polygonal shape with a vertex oriented orthogonal to the stacked signal line bundle.

Many signal routing structures, variations, and combinations are described. In a specific exemplary embodiment, a signal routing includes a lower metal layer including a first pair of reference lines, and one or more lower signal lines between the first pair of reference lines, an upper metal layer including a second pair of reference lines above the first pair of reference lines, and one or more upper signal lines above the one or more lower signal lines, and an interlayer dielectric layer vertically between the lower metal layer and the upper metal layer. Each of the one or more first and second signal lines may be characterized by a corresponding thickness that is greater than a width.

BRIEF DESCRIPTION OF THE DRAWINGS

FIG. 3A is a schematic top view illustration of a signal bundle including a plurality of twisted signal lines in accordance with an embodiment.

FIGS. 3B-3H are schematic cross-sectional side view illustrations taken along lines B-B through H-H of FIG. 3A in accordance with embodiments.

FIG. 4A is a schematic top view illustration of an arrangement of pads over underlying signal lines in accordance with an embodiment.

FIG. 4B is a schematic cross-sectional side view illustration of an arrangement of signal lines underneath a pad in accordance with an embodiment.

FIG. 4C is a schematic cross-sectional side view illustration of an arrangement of signal lines underneath a rotated pad in accordance with an embodiment.

FIGS. 5-6 are schematic bump pattern illustrations for signal and ground lines in accordance with embodiments.

DETAILED DESCRIPTION

Figure 1A:
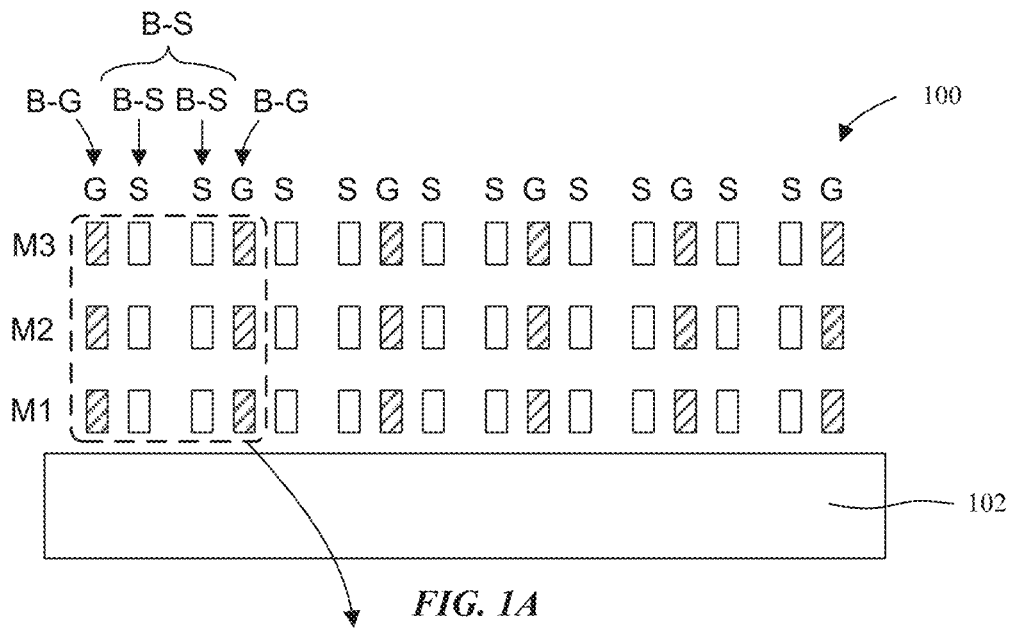
FIG. 1A a cross-sectional side view illustration of a signal routing in accordance with an embodiment.

Embodiments describe routing structures including signal routing that connects die areas. The signal routing may be contained within different physical configurations. In some embodiments, the signal routing is contained within an interposer on which separate dies are mounted. In such a configuration, the signal routing is off-chip. In some embodiments, the signal routing is on the same substrate that the separate die areas are formed in. In such a configuration, the signal rouging is on-chip, or part of the same chip as the separate die areas. In particular, the routing structures in accordance with embodiments may be employed in high density routing applications. Various routing structures are described in which wiring pitch and density is adjusted to manage performance and facilitate high data rate signaling, high density wiring, or both. For example, the pitch/density influences resistance (e.g. due to width), and RC rise time. Additionally, the pitch/density influences crosstalk due to mutual-capacitance and mutual-inductance. A reduction in crosstalk in accordance with embodiments may facilitate more signal margin, or facilitate lowering of voltages (power).

In one aspect, embodiments describe routing structures including signal and reference lines characterized by cross-sectional thicknesses that are greater than their widths, and resultant aspect ratios (thickness/width) greater than 1, or 1 to 3. This may be an attribute of a high density routing layout in accordance with embodiments that may mitigate mutual-capacitance between signal lines (e.g. signal coupling), and promote self-capacitance with reference lines (e.g. self-capacitance). While not being limited to a particular theory, crosstalk (or coupling coefficient) for the routing structure may be proportional to the ratio of mutual-capacitance to self-capacitance (and self-inductance to mutual-inductance). Routing structures in accordance with embodiments, may achieve a specified crosstalk value by controlling the ratio of mutual-capacitance to self-capacitance.

In one aspect, embodiments describe bundled routing structures in which the signal lines may include intra-layer switching, inter-layer switching and/or twisting, for example, in a manner similar to a coaxial or twisted pair cable. In such configurations, crosstalk for the routing structure may be represented by an average of the signal lines as opposed to a worst value of the signal lines. For example, in a conventional printed circuit board (PCB) or multi-chip module (MCM) vias are accommodated with pads, keep out zones, etc. that results in relatively large pitch vias relative to the wiring density. In accordance with embodiments, the vias within the bundled routing structures may have via widths and/or pitches approximately 1× to 2× of the technology defined minimum wiring pitch. The illustrated wiring pitch may vary with applications, for short dense interconnect minimum width and/or pitch may be practical, whereas for longer interconnect, non-minimum width and/or pitch may be used (such as 1-4× technology minimum). Thus, selection of line width of the signal lines (Sw) and reference lines (Gw), spacing (e.g. $D_{SSH}$), and pitch may be made for a performance goal, and length of the trace lines. For example, for lower performance and shorter interconnects, the metal traces may be selected closer to the technology defined minimums, while for higher performance and longer interconnects, the metal traces may have non-minimum dimensions, spacing, pitch. In accordance with some embodiments, the vias may be approximately the same width or smaller than the minimum width of the metal traces forming the signal lines or reference lines the vias connect so that the vias are substantially landed on the metal traces. This structurally facilitates the switching and twisting, at lower cost. This may be accomplished using a damascene process, such as dual damascene, for the formation of the metal traces and vias.

In another aspect, embodiments, describe pad shapes and orientations that may reduce crosstalk area with underlying signal lines. In such configurations, crosstalk for the routing structure may be mitigated by reducing the total area of the signal lines running directly underneath the pads. The pads may vary depending upon configuration, such as on-chip or off-chip. For example, the pads in an on-chip configuration may be those to connect the chip to another substrate (e.g. chip bumps, etc.). The pads in an off-chip configuration may be those reserved for micro bumps for chip (e.g. system on chip) connections as well as for those to connecting routing (e.g. through silicon vias) through an interposer body to the substrate side pads of the interposer. In such a configuration, the pads may be through silicon via (TSV) pads, for example.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between" and "on" as used herein may refer to a relative position of one layer with respect to other layers. One layer "above", "over" or "on" another layer or bonded "to" or in "contact" with another layer may be directly in contact with the other layer or may have one or more intervening layers. One layer "between" layers may be directly in contact with the layers or may have one or more intervening layers.

Figure 1B:
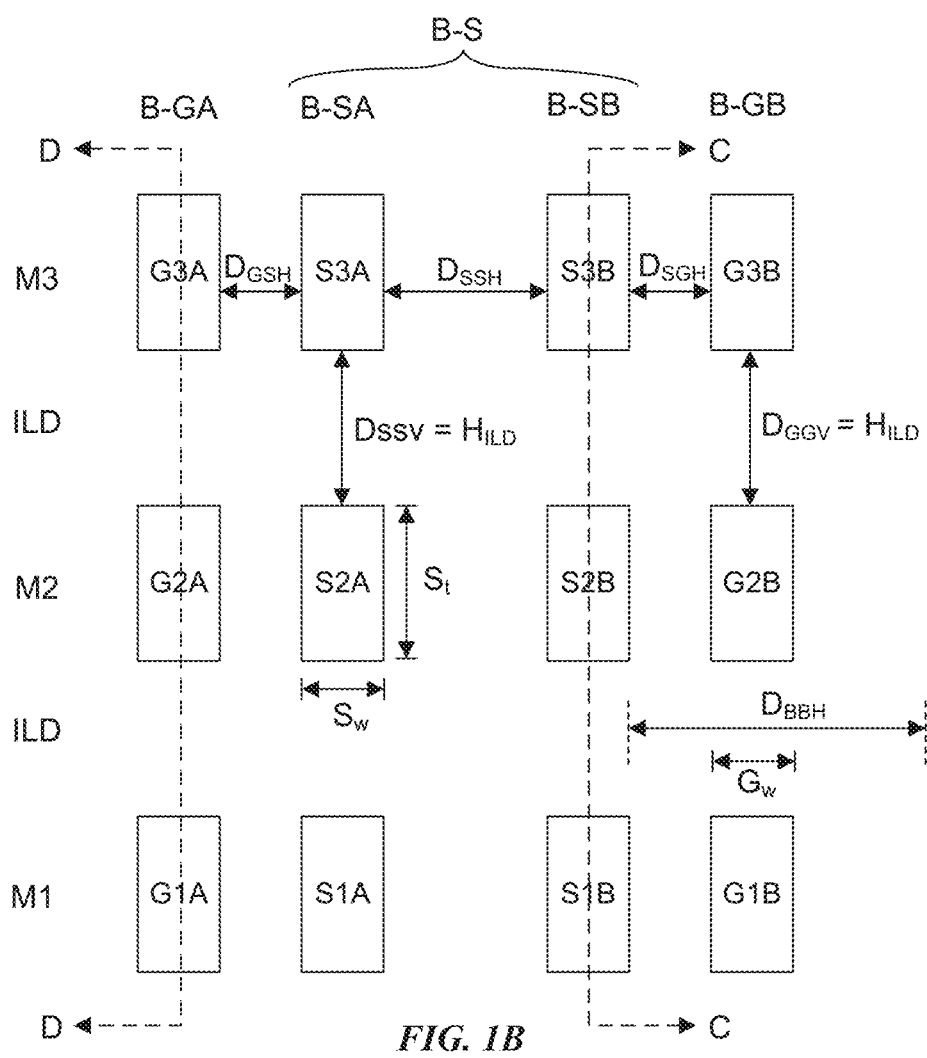
FIG. 1B is a close-up illustration of a portion of the signal routing of FIG. 1A in accordance with an embodiment.

Referring now to FIG. 1A a cross-sectional side view illustration is provided of a signal routing 100 formed on or within substrate 102. FIG. 1B is a close-up illustration of a portion of the signal routing of FIG. 1A. The exemplary signal routings 100 illustrated in FIGS. 1A-1B may be included in a variety of routing structures to connect die areas in accordance with embodiments. In accordance with embodiments, substrate 102 may be a semiconductor substrate (e.g. silicon) containing one or more die areas. For example, in the exemplary embodiment illustrated in FIG. 8 the signal routing 100 may connect on-chip die areas 802, 804 formed within a same substrate 102 of a chip 803. In accordance with embodiments, substrate 102 may be an interposer substrate, PCB, or other MCM substrate. Exemplary materials for substrate 102 silicon, polyimide, glass-reinforced epoxy laminate (also referred to as FR4), glass, other laminates, etc. For example, in the exemplary embodiment illustrated in FIG. 9 the signal routing 100 may be formed in a substrate 102, such as interposer substrate, to connect separate die areas 902, 904 formed in separate chips 903, 904.

Referring again to FIGS. 1A-1B, the signal routing 100 may include multiple metal layers (e.g. M1, M2, M3 . . . Mn), signal lines (S), and reference lines (G). For example, reference lines (G) may be reference current return paths (e.g. ground reference (Vss), power reference (Vdd), and combinations thereof). A plurality of signal lines (S) in a plurality of metal layers may form a signal line bundle (B-S), while a plurality of reference lines (G) in a plurality of metal layers may form a reference line bundle (B-G).

Additionally, a signal line bundle (B-S) may include a plurality of signal lines (S) within a single metal layer in combination with a plurality of metal layers. Embodiments are not limited to three metal layers M1-M3, and may include more or less. Furthermore, the arrangement and ratio of signal lines (S) and reference lines (G) is variable. Thus, the particular arrangement illustrated in FIGS. 1A-1B is understood as a particularly graceful implementation in accordance with embodiments.

In the following exemplary description the relative locations and sizes of signal lines (S) and reference lines (G) is made with regard to upper and lower metal layers. As shown, columns of vertically stacked signal lines (S) can be referred to a signal line bundle B-SA, B-SB, and columns of vertically stacked references lines (G) can be referred to as a reference line bundle B-GA, B-GB. Additionally, multiple stacked signal lines (S) can be referred to as a signal line bundle B-S. Thus, signal line bundles B-SA, B-SB can be combined as a signal line bundle B-S. The vertically stacked signal lines (S) may be directly above one another, and overlapping as illustrated, however, this is not required (see for example, FIG. 7B). In an embodiment, the vertically stacked signal lines (S) do not overlap, or partially overlap. In the exemplary illustration provided an upper metal layer may be M3 or M2, while a lower metal layer is M2 or M1, respectively. Thus, a lower metal layer may be the metal layer containing a specific signal or reference line immediately below the upper metal layer containing a specific signal or reference line. In an embodiment, a signal routing 100 includes a lower metal layer (e.g. M2) including a first pair of reference lines (G2A, G2B) and a first pair of signal lines (S2A, S2B) between the first pair of reference lines (G2A, G2B), and an upper metal layer (e.g. M3) including a second pair of reference lines (G3A, G3B) above the first pair of reference lines (G2A, G2B) and a second pair of signal lines (S3A, S3B) above the first pair of signal lines (S2A, S2B). An interlayer dielectric layer (ILD) may be disposed vertically between the lower metal layer M2 and the upper metal layer M3.

Figure 1C:
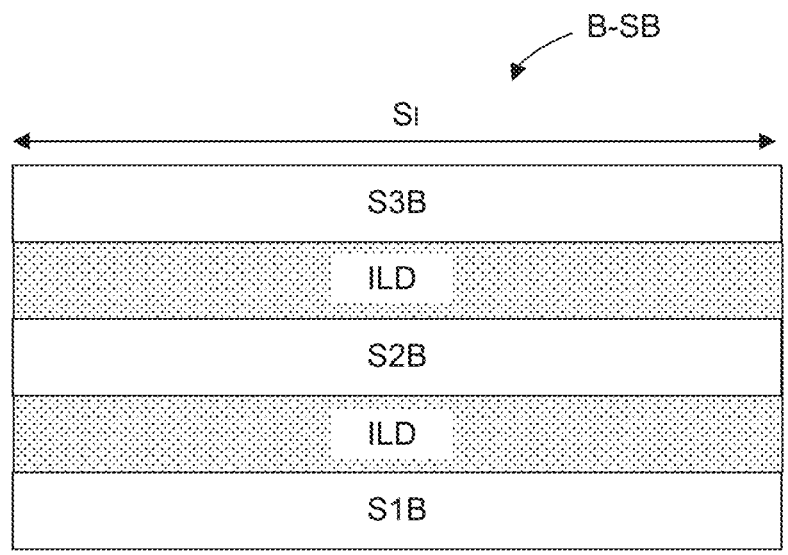
FIG. 1C is a schematic side view illustration of a signal line bundle taken along line C-C of FIG. 1B in accordance with an embodiment.

Crosstalk among signal lines (e.g. coupling coefficient) in accordance with embodiments may be reduced by mitigating mutual-capacitance, while facilitating self-capacitance. In particular, this may be achieved by controlling overlapping surface areas between adjacent wirings (e.g. signal and reference lines) and distance between the respective wirings. In an embodiment, each of the first and second pairs of signal lines (S2A, S2B; S3A, S3B) is characterized by a corresponding thickness (St) that is greater than a width (Sw). In an embodiment, each of the first and second pairs of reference lines (G2A, G2B; G3A, G3B) is characterized by a corresponding thickness (Gt) that is greater than a width (Gw). As shown, the first metal layer M2 signal line surface area horizontally overlapping between the first pair of signal lines (S2A, S2B) is greater than a first-to-second metal layer signal line surface area vertically overlapping between a lower signal line (S2A) of the first pair of signal lines and corresponding upper signal line (S3A) of the second pair of signal lines directly over the lower signal line (S2A). For example, the first metal layer M2 signal line surface area horizontally overlapping between the first pair of signal lines (S2A, S2B) may be determined by the thickness (St) of the signal lines (S2A, S2B) and overlapping length (S1) of the signal lines (S2A, S2B), which would be orthogonal into the illustration; see also FIG. 1C. For example, the first-to-second metal layer signal line surface area vertically overlapping between a lower signal line (S2A) and corresponding upper signal line (S3A) may be determined by the width (Sw) of the signal lines (S2A, S3A) and overlapping length of the signal lines (S2A, S3A), which would be orthogonal into the illustration.

Figure 1D:
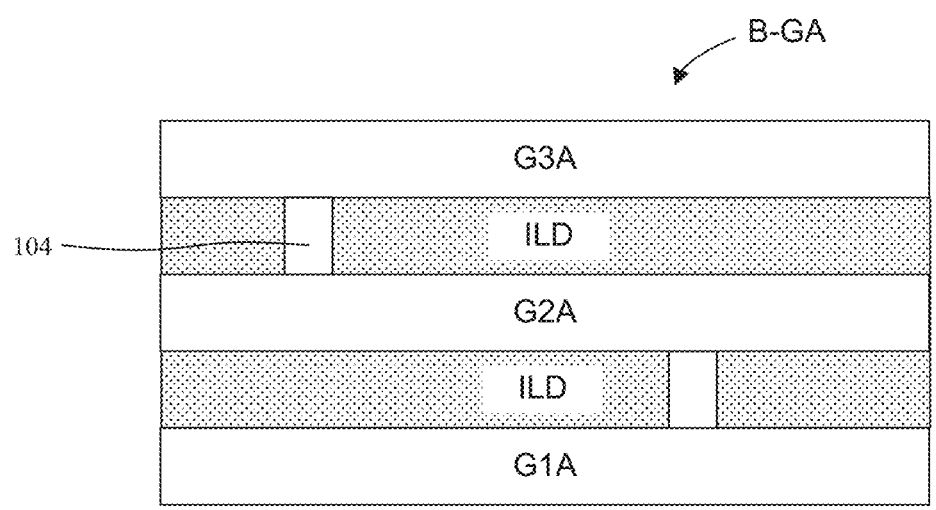
FIG. 1D is a schematic side view illustration of a reference line bundle taken along line D-D of FIG. 1B in accordance with an embodiment.

Still referring to FIG. 1B, the first pair of signal lines (S2A, S2B) may be separated by a horizontal distance $D_{SSH}$, a left reference line (G2A) of the first pair of reference lines is separated from a left signal line (S2A) of the first pair of signal lines by a horizontal distance of $D_{GSH}$, a right reference line (G2B) of the first pair of reference lines is separated from a right signal line (S2B) of the first pair of signal lines by a horizontal distance of $D_{SGH}$, and the lower metal layer is separated from the upper metal layer by an interlayer dielectric layer height $H_{ILD}$, where $D_{SSH}$ and $H_{ILD}$ are greater than $D_{GSH}$ and $D_{SGH}$. Thus, vertically oriented signal lines (S) and reference lines (G) may be separated by a vertical distance $D_{SSV}$ and $D_{GGV}$, respectively, that is equal to $H_{ILD}$. $D_{SSH}$ may be approximately one to five times a horizontal distance as $D_{GSH}$. In a particular configuration $D_{SSH}$ is equal to $H_{ILD}$. In a particular configuration $D_{SSH}$ is greater than $H_{ILD}$ (such as two to three times). In an embodiment, $D_{GSH}$ is equal to $D_{SGH}$. In a particular configuration $D_{SSH}$ is twice $H_{ILD}$, and $D_{GSH}$ is equal to $D_{SGH}$. For example, $D_{SSH}$ may be twice a horizontal distance as $D_{GSH}$ in a particular embodiment. In an embodiment, $H_{ILD}$ is approximately equal to a thickness of the lower metal layer (e.g. M2) or the upper metal layer (e.g. M3). The metal layers may also have the same or different thicknesses. For example, higher metal layers may be thicker than lower metal layers. Metal traces may also have the same width in different metal layers, or be wider in higher metal layers than in lower metal layers. Referring to FIG. 1D, the stacked reference lines (e.g. G1A, G2A, G3A) can optionally be electrically connected, for example, with one or more vias or trenches 104 extending through the ILDs.

It is to be appreciated, that while the ILD height and metal layer thicknesses, widths, and spaces are illustrated as identical, these parameters may vary between layers. Additionally, wiring aspect ratios (trace cross-sectional thickness/width) are variable. For example, high aspect ratios such as those illustrated in FIGS. 1A-1B (aspect ratio=2), may be particularly applicable for on-chip, and on-chip like interconnects, employing fabrication techniques such as dual damascene, for example, where high aspect ratios can be built. For other applications such as PCB, MCM, etc. more traditional wiring may be employed with lower aspect ratios (e.g. near 1). Though it may be possible to also employ higher aspect ratios in PCB, MCM.

As opposed to traditional PCB, MCM where a ground place has a comparatively low resistance compared to signal lines, in some embodiment the reference lines (G) and signal lines (S) may have comparable resistance due to wire shapes as opposed to planes. In an embodiment, the reference line width (Gw) may be increased relative to the signal line width (Sw) to lower resistance. As shown, in FIG. 1B, an increased reference line width (Gw) may result in increased distance between signal lines in adjacent bundles $D_{BBH}$. Such a structure may require more space, while reducing crosstalk.

Figure 2A:
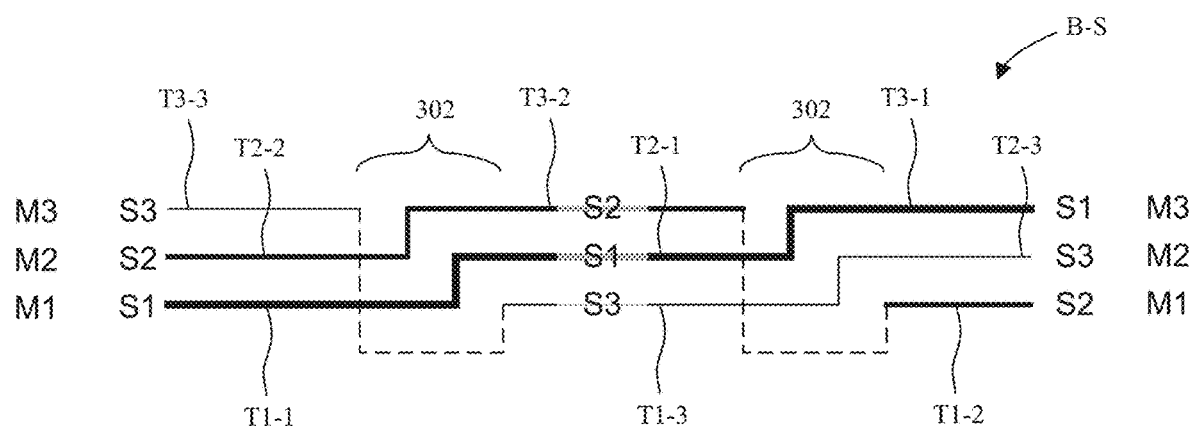
FIG. 2A is a schematic side view illustration of a plurality inter-layer switch regions in accordance with an embodiment.

In accordance with embodiments, the signal lines (S) within a signal line bundle (B-S) may switch between layers (inter-layer switching), switch between wires/metal trace lines within a layer (intra-layer switching), and be twisted, for example, in a manner similar to a coaxial cable. In such configurations, crosstalk for the routing structure may be represented by an average of the signal lines as opposed to a worst value of the signal lines. Also the capacitance and inductance can be averaged. FIG. 2A is a schematic side view illustration of a signal line bundle (B-S) with interlayer switching in accordance with an embodiments. It is to be appreciated that the number of signal lines (S) and metal layers (M) are exemplary, and the particular arrangement presented is for illustrative purposes only, and embodiments are not so limited. As shown, a plurality of signal lines S1, S2, S3, etc. which run between die areas, may traverse multiple metal layers M1, M2, M3, etc. The paths of the signal lines may run through inter-layer switch regions 302 in which the signal lines traverse between different metal layers. For example, this may be accomplished through vias connecting two separate metal layers. Each inter-layer switch region 302 may include traversals between metal layers for only one, or multiple signal lines. Thus inter-layer switch regions 302 may be staggered for each signal line, or a plurality of signal line traversals may be grouped together in a same inter-layer switch region 302. By way of example, from left to right, the third signal line (S3) traverses from the third metal layer (M3) to the first metal layer (M1) in a first inter-layer switch region 302, and then from the first metal layer (M1) to the second metal layer (M2) in a second inter-layer switch region 302. As shown, a group of signal lines (S1, S2, S3) can traverse to respectively different metal layers in the same inter-layer switch regions 302. A variety of different configurations are possible. In the exemplary embodiment illustrated in FIG. 2A, signal path S3 traverses from the stacked trace line T3-3 in M3 to stacked trace line T1-3 in M1 in a first inter-layer switch region 302. Signal path S3 then traverses from stacked trace line T1-3 in M1 to stacked trace line T2-3 in a second inter-layer switch region 302. Similarly signal path S2 may traverse stacked trace lines T2-2, T3-2, T1-2, and signal path S1 may traverse stacked trace lines T1-1, T2-1, T3-1. In an embodiment, the signal lines S1, S2, S3 are substantially stacked on top of one another vertically, though some lateral traversal may be provided within the inter-layer switch regions.

Figure 2B:
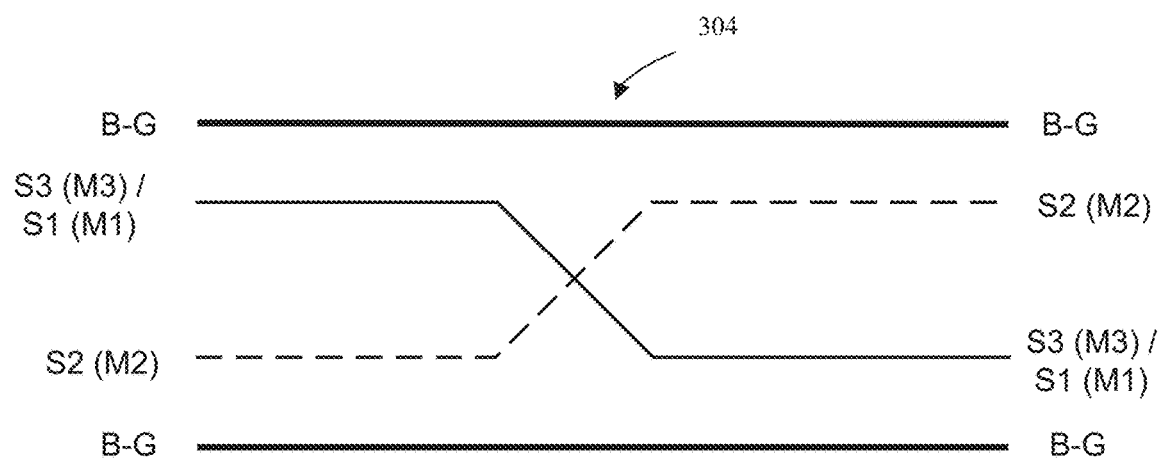
FIG. 2B is a schematic top view illustration of intra-layer switch region in accordance with an embodiment.
Figure 7A:
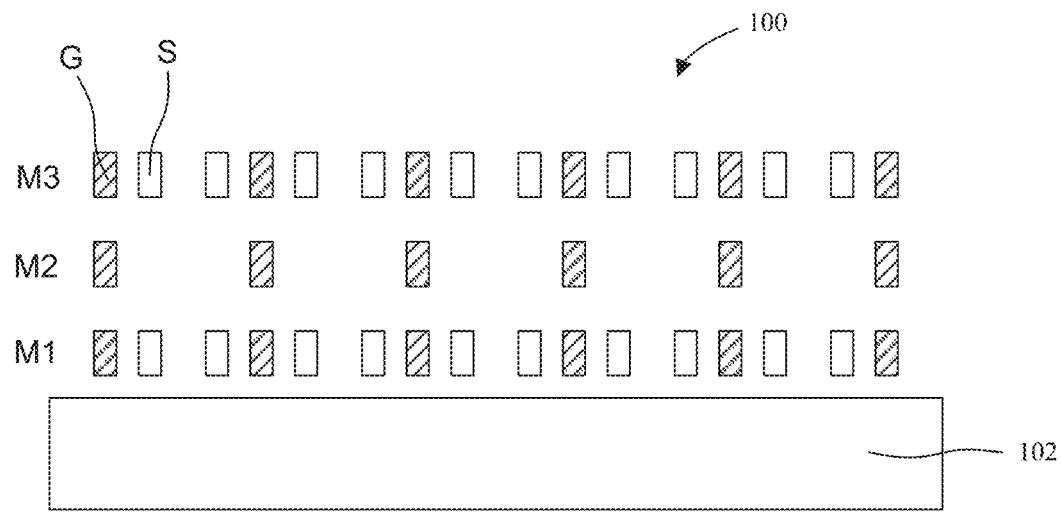
FIGS. 7A-7C are cross-sectional side view illustrations of various signal routing arrangements in accordance with embodiments.
Figure 7B:
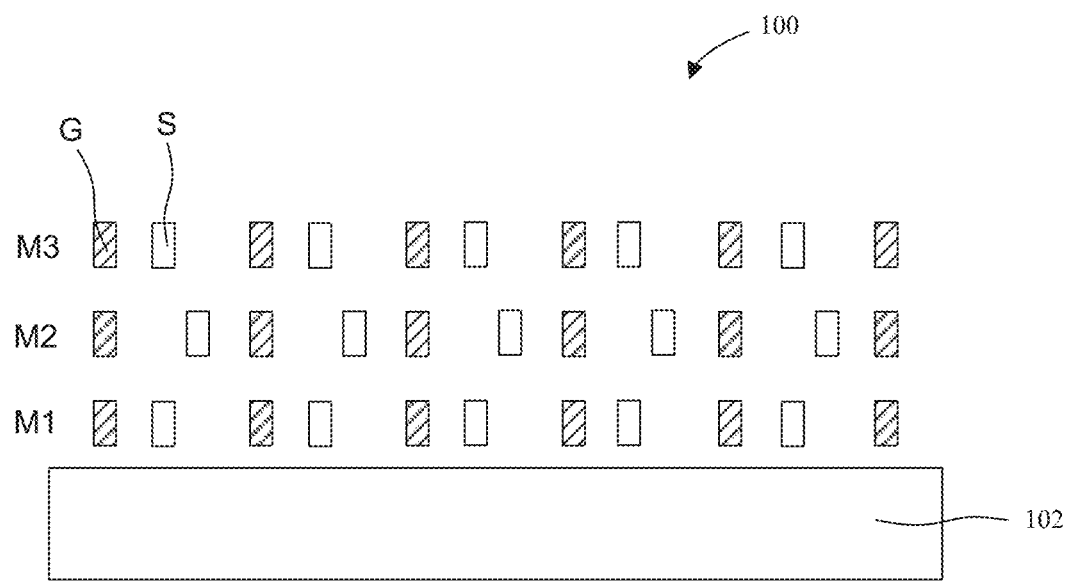

Referring now to FIG. 2B, a schematic top view illustration is provided of intra-layer switching between signal lines within a single metal layer in accordance with an embodiments. Specifically, FIG. 2B is a schematic top view illustration of the signal and reference lines shown in the embodiment illustrated in FIG. 7B. In the embodiment illustrated in FIG. 2B, signal lines (S1) and (S3) from metal layers (M1) and (M3) are illustrated as a single line to illustrated they are directly above one another, as shown in FIG. 7B. In the embodiment illustrated, intra-layer switch regions 304 are shown where the horizontal location of the signal lines (S1, S3) and (S2) are switched. This may be utilized to accommodate an environmental change (and averaging) for the signal. For example, signals (S1, S3) may be an aggressor while signal (S2) is a victim. The aggressor may be neighboring signals, and pads as shown in FIG. 4. While the simplified example provided in FIG. 2B only shows a single signal line between adjacent reference lines (G), embodiments are not so limited, and intra-layer switching occur with multiple signal lines (S) between reference lines (G). Additionally, intra-layer switching may occur with signal lines (S) and reference lines (G). For example, a signal line may switch to a wire/trace line area vacated by a reference line, or another signal line. Additionally, intra-layer switching may be combined with inter-layer switching, for example, to form a twisted bundle.

Referring now to FIG. 3A a schematic top view illustration is provided of a signal bundle including a plurality of twisted signal lines in accordance with an embodiment. FIGS. 3B-3H are schematic cross-sectional side view illustrations taken along lines B-B though H-H of FIG. 3A in accordance with embodiments. In interests of clarity and conciseness, the embodiments of FIGS. 3A-3H resemble the structure of FIG. 2B, though embodiments are not so limited. Referring now to FIG. 3B the starting point for a partial rotation step is illustrated, with signal lines S1-S6 corresponding to signal lines S1A-S13 and S1B-S3B of FIG. 2B. Referring to FIG. 3C, the ground traces corresponding to (G2B) and (G1B) are vacated in the cross section in order to make room for rotation of signal line (S5). As shown in FIG. 3D, signal line (S5) moves from the second metal layer (M2) to the first metal layer (M1). Thus, the signal line (S5) is illustrated as undergoing intra-layer switching to the vacated reference wire/trace line area, and inter-layer switching to from the second metal layer to the first metal layer with a via 104.

Referring now to FIG. 3E, signal line (S6) undergoes inter-layer switching from the third metal layer (M3) to (M2). In FIG. 3F signal line (S2) switches from M2 to M3. In FIG. 3G signal line (S3) switches from (M1) to (M2). FIG. 3H represents completion of the step rotation, or clockwise twist, of the signal lines in which signal lines (S5) and (S4) jog in the first metal layer (M1), or undergo intra-layer switching.

In accordance with embodiments, intra-layer switching, inter-layer switching, and/or twisting may average the self-capacitance of the bundled structure, as opposed to having a worst self-capacitance value. Furthermore, mutual-capacitance (and mutual-inductance mutual resistance) among the signal lines can be averaged, resulting in a net reduction in crosstalk. Further, impact of pads on signal perturbations can be averaged. In accordance with embodiments, it is not necessarily required to twist or switch all signal lines, and any set (including all) of the signal lines may be twisted or switched.

In an embodiment, routing structure includes first die area, a second die area, and a signal routing connecting the first die area and the second die area. The signal routing 100 includes a first group of stacked reference lines in a corresponding plurality of metal layers, a second group of stacked reference lines in the corresponding plurality of metal layers, a group of stacked trace lines horizontally between the first and second groups of stacked reference lines in the corresponding plurality of metal layers. A plurality of switch and/or twist regions interconnect the group of stacked trace lines to form a bundle of twisted signal lines (B-S) with corresponding signal paths S1, S2, S3 that periodically change between the plurality of metal wires/trace lines and/or layers M1, M2, M3.

Referring now to FIGS. 4A-4C, in accordance with embodiments, the signal routing may additionally span directly underneath one or more pads 202. The uppermost signal lines closest to the pads 202 may switch and/or twist with the underlying signal lines. This may additionally, reduce cross talk, and average the self-capacitance of the bundled structure, as opposed to having a worst self-capacitance value. Furthermore, mutual-capacitance among the signal lines can be averaged, resulting in a net reduction in crosstalk In accordance with embodiments, the routing structures may include pad shapes and orientations that may reduce crosstalk area with underlying signal lines. FIG. 4A is a schematic top view illustration of an arrangement of pads 202 over underlying signal lines in accordance with embodiments. For example, pads 202 may correspond to any of pads 820, 920, 930 described herein. Thus, it is to be appreciated that while the relative orientation of the pads 202 and signal lines (S), etc. is described and illustrated with the pads 202 over underlying signal lines, that the relative orientation may be reversed. For example, FIGS. 4B-4C illustrate pads 820, 930 as being over underlying signal lines (S), which are also over underlying pads 920. Taken from an opposite perspective, FIGS. 4B-4C also illustrate pads 920 as being over the underlying signal lines (S). In interest of consistency, the particular embodiment illustrated in FIG. 4A is representative of a routing structure similar to that illustrated as described with regard to FIGS. 1A-1B and FIGS. 3A-3H including pairs of signal lines (S) between reference lines (G), though embodiments are not so limited. In an embodiment, routing structure includes first die area, a second die area, and a signal routing connecting the first die area and the second die area. The signal routing 100 includes a plurality of stacked reference lines extending between the first die area and the second die area, and a plurality of stacked signal line bundles (B-SA), (B-SB) extending between the first die area and the second die area. In the exemplary embodiment illustrated in FIG. 4A, one or more pads 202 (e.g. 820, 920, 930) are directly over a stacked signal line bundle of the plurality of stacked signal line bundles, and the one or more pads 202 have a polygonal shape with a vertex (V) oriented orthogonal to the stacked signal line bundle.

In the event the pad to top signal crosstalk is large due to mutual capacitance, and noise injection due to signal toggling, some local solutions can be applied. These may constitute, using the top signal layer as a shield (from pad), and also rotating the pad, to minimize the number of signals impacted. FIG. 4B is a schematic cross-sectional side view illustration of an arrangement of signal lines underneath a pad 202 (e.g. pad 820 of FIG. 8, micro bump pad 930 of FIG. 9, or other pad 920 of FIG. 9) in accordance with an embodiment. In such a configuration, the track segment of the uppermost metal layer above underlying signal lines may be used as both a ground and shield. Another option may be to leave the track segment vacant. Such configurations may additionally reduce self-capacitance with the pads 202.

FIG. 4C is a schematic cross-sectional side view illustration of an arrangement of signal lines underneath a rotated pad 202 (e.g. 820, 920, 930) in accordance with embodiments. Such a configuration may also be utilized to reduce self-capacitance with the pads. As shown in FIG. 4A, and the close up cross-sectional side view illustrates in FIGS. 4B-4C, the rotated pads 202 can result in a reduced total area of the signal lines running directly underneath the pads 202. As shown in FIG. 4C, the cap area 210 of the pad 202 over underlying signal area may be reduced relative to FIG. 4B. As a consequence, the total self-capacitance with the pads 202 may be reduced, and allow for use of a greater number of signal lines (S) running underneath the pads 202. For example, in the embodiment illustrated in FIG. 4B, the track segment of the top metal layer (M3) running underneath the pads 202 is utilized as a reference line (G), or left vacant, in order to reduce crosstalk. Such a configuration may be implemented if the pad-signal trace coupled beyond a specified tolerance. In the particular example illustrated, 4 signal lines are implemented for this set. In the exemplary embodiment illustrated in FIG. 4C, the track segment of the top metal layer (M3) running underneath the pads 202 also accommodates signal lines (S), since crosstalk is sufficiently mitigated. In this particular embodiment illustrated, the potential impact is to implement 6 signal lines for this set, thus enabling higher data rate signaling of the routing structure. It is to be appreciated that the particular configurations, and number of signal lines and reference lines is exemplary, and embodiments are not so limited. Furthermore, while illustration and reference is only shown for track segments adjacent pads 820, 930, similar structures may be formed for track segments adjacent pads 920.

Referring again to FIG. 4A, the signal routing 100 may be used to connect adjacent die areas in a routing structure. The signal routing 100 includes a plurality of stacked reference lines (G) extending between the first die area and the second die area, a plurality of stacked signal line (S) bundles extending between the first die area and the second die area. One or more pads 202 are directly over a stacked signal line (S) bundle of the plurality of stacked signal line bundles. One or more pads 202 may have a polygonal shape with a vertex (V) oriented orthogonal to the stacked signal line (S) bundle. In such configurations, crosstalk for the routing structure may be mitigated by reducing the total area of the signal lines running directly underneath the pads, and consequentially, the number of signal lines may potentially be increased.

Referring now to FIG. 5 a schematic bump pattern is illustrated for signal and ground lines in accordance with embodiments. For example, the bump pattern may correspond to any of the signal routings 100 described herein. As shown, each signal line bundle (B-SA), (B-SB), (B-S) may include signal lines (S) routed to corresponding pads 202. As shown, each reference line bundle (B-G) may be routed to a corresponding pad 202. In such a configuration, the reference line bundle (B-G) pads 202 to signal line bundle (B-S) pads 202 is 1:1. Referring now to FIG. 6, a schematic bump pattern is illustrated in which the reference line bundles (B-G) are connected to an automatic placement (AP) routing 602. In such a configuration, the reference (e.g. ground) burden is reduced. For example, in the exemplary illustration provided the reference line bundle (B-G) pads 202 to signal line bundle (B-S) pads 202 is 1:2. Thus, the number of signal to ground pads can be increased. Similarly this can be applied to other higher ratio like 1:3 or higher. Also shown in FIGS. 5-6, any leftover area, as signals (from other bundles) reach their destinations, can be used to build capacitors 502 for power integrity. Also the extra available area can be used to expand the signal spacing, ground wire width (reduced resistance, and isolation to next set of signals) etc, to improve signal propagation and loading properties.

Figure 7C:
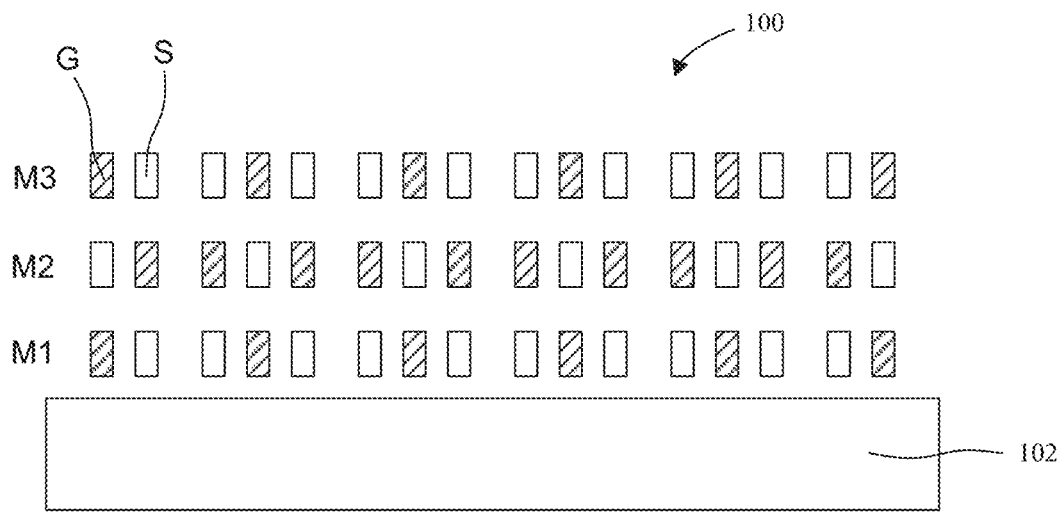
Figure 7D:
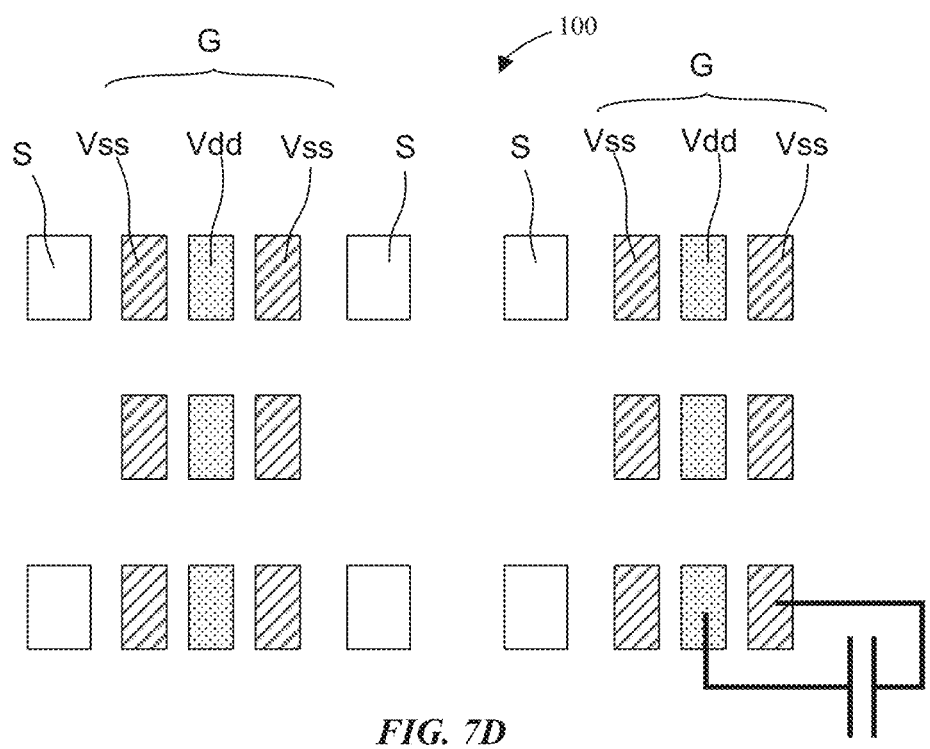
FIG. 7D is a cross-sectional side view illustration of a reference line arrangement in accordance with an embodiment.

While embodiments have been described with regard to FIGS. 1A-6 including similar ratios of signal lines (S) and reference lines (G) and metal layers, embodiments are not so limited and may be applied to a variety of configurations. In the embodiment illustrated in FIG. 7A, the signal lines (S) in the second metal layer (M2) are vacated. This increases the vertical distance between the signal lines, and improves cross-talk. Additionally, mutual-resistance may be improved due to more reference line resources. The embodiment illustrated in FIG. 7B also provides an alternative signal routing 100 structure. For example, the signal routing structure may include three signal lines between reference line bundles (B-G). Furthermore, the signal lines (S) in adjacent metal layers may be laterally offset from one another. For example, they may not be directly above one another. FIG. 7C provides an illustration of a checkerboard pattern of signal lines (S) and reference lines (G) in accordance with an embodiment. Such an arrangement may increase the average lateral distance between signal lines (S). Referring now to FIG. 7D, the reference lines (G) may include a plurality of lines. For example, these may include mixed Vdd (high voltage), and Vss (low voltage) lines. Such an embodiment is an example of turning signal line (S) pitch and mutual parasitics. This may also for distributed decoupling between Vdd and Vss. In addition, these Vdd/Vss lines can be used to connect any additional capacitors that may be available (like Metal-Insulator-Metal capacitors, trench capacitors, etc.). For example, these may be capacitors 502 described with regard to FIGS. 5-6. The capacitors may be located adjacent any of the signal routing 100 structures described herein. The embodiments illustrated in FIGS. 7A-7D, as well as other variations, may be combined with other embodiments described herein, such as to include rotated pads 202, twist regions 302, AP routing 602, and relative dimensions such as those described with regard to FIG. 1B.

Figure 8:
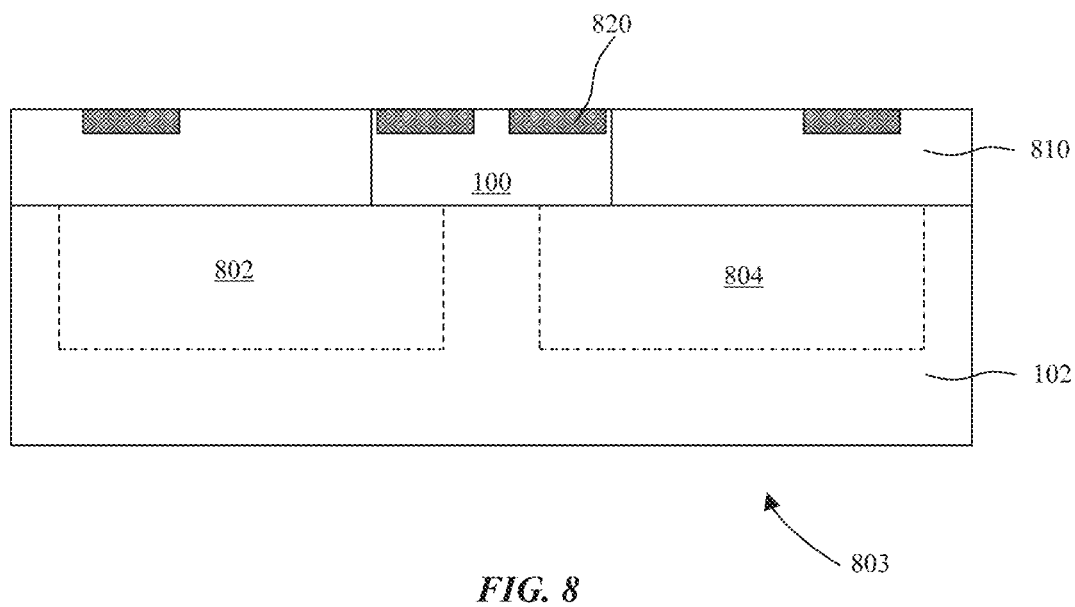
FIG. 8 is a schematic cross-sectional side view illustration of an on-chip signal routing in accordance with an embodiment.

The routing structures in accordance with embodiments may be integrated into various structures, including on-chip or off-chip signal routing 100. FIG. 8 is a schematic cross-sectional side view illustration of an on-chip signal routing 100 in accordance with an embodiment. For example, substrate 102 may be a semiconductor substrate (e.g. silicon) containing one or more die areas 802, 804 formed within the substrate 102 of chip 803. A build-up structure 810 including electrical routing layers may be formed on the silicon substrate. In the embodiment illustrated the signal routing 100 is an integral part of the build-up structure 810, formed of the same dielectric and metal layers. In an embodiment, the signal routing 100 is a separate component, embedded within the build-up structure 810. Still referring to FIG. 8, a plurality of pads 820 are formed at an opposite side of the build-up structure 810 than the substrate 102. For example, the pads 820 may be landing pads for ball attach, stud bumps, etc. In accordance with embodiments, the signal routing 100 illustrated in FIG. 8 is contained within a single chip 803, and may be considered on-chip. Thus, the single chip 803 may be considered a monolithic structure, even with multiple connected die areas (e.g. multiple central processing units, or graphics processing units, etc.).

Figure 9:
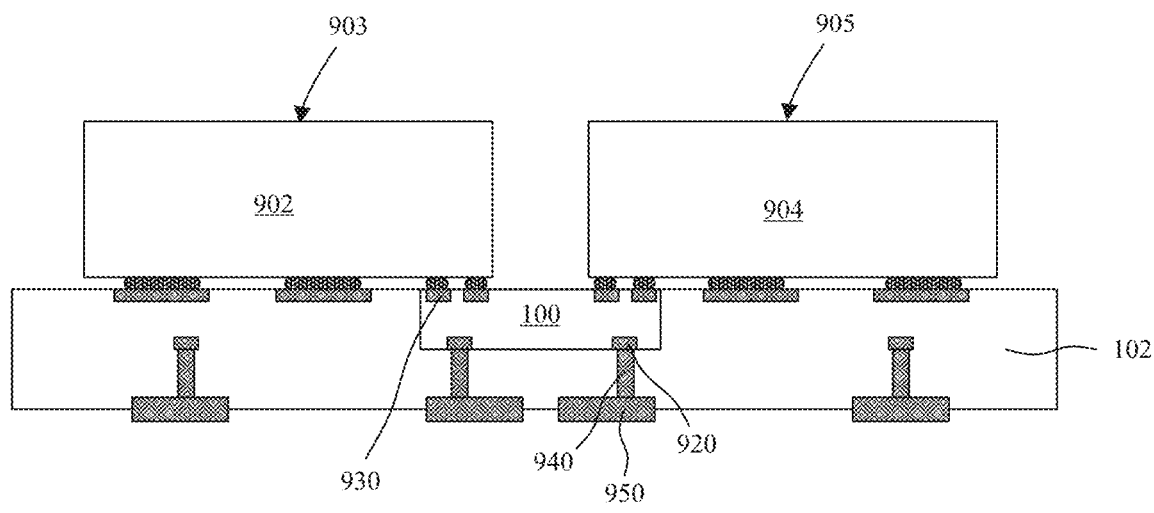
FIG. 9 is a schematic cross-sectional side view illustration of an off-chip signal routing in accordance with an embodiment.

FIG. 9 is a schematic cross-sectional side view illustration of an off-chip signal routing 100 in accordance with an embodiment. The signal routing 100 may be formed in a substrate 102 to connect separate die areas 902, 904 formed in separate chips 903, 905. For example, the substrate 102 may be an interposer substrate, formed of a variety of metal and dielectric materials such as glass, polyimide, glass-reinforced epoxy laminate (also referred to as FR4), glass, other laminates, etc. The chips 903, 905 may be surface mounted onto pads 930 of substrate 102, for example, with micro-bumps, etc.

In the embodiment illustrated the signal routing 100 may be an integral part of the substrate 102, formed of the same materials. In an embodiment, the signal routing 100 is a separate component, such as a silicon bridge embedded within the substrate 102. Still referring to FIG. 9, a plurality of pads 920 may be included to connect with routing through an interposer body (e.g. TSVs 940) to substrate side pads 950 are formed at an opposite side of the substrate 102 than the chips 903, 905. For example, the pads 950 may be landing pads for ball attach, stud bumps, etc. In accordance with embodiments, the signal routing 100 illustrated in FIG. 9 connects separate discrete chips 903, 905, and may be considered off-chip.

In utilizing the various aspects of the embodiments, it would become apparent to one skilled in the art that combinations or variations of the above embodiments are possible for forming routing structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A routing structure comprising:
   a first die area;
   a second die area;
   a signal routing connecting the first die area and the second die area, wherein the signal routing comprises:
      a plurality of stacked reference lines extending between the first die area and the second die area;
      a stacked signal line bundle extending between the first die area and the second die area;
      one or more pads directly over the stacked signal line bundle, wherein the one or more pads have a polygonal shape with a vertex oriented orthogonal to the stacked signal line bundle.

2. The routing structure of claim 1, wherein the stacked signal line bundle includes a plurality of inter-layer switch regions in which a signal path changes between a plurality of metal layers.

3. The routing structure of claim 2, further comprising a vacated track region of an uppermost metal layer directly underneath the one or more pads and over the stacked signal line bundle.

4. The routing structure of claim 2, further comprising one or more reference lines in an uppermost metal layer directly underneath the one or more pads and over the stacked signal line bundle.

5. The routing structure of claim 2, wherein the stacked signal line bundle occupies an uppermost metal layer directly underneath the one or more pads.

6. The routing structure of claim 2, wherein the signal routing is formed in a substrate that is separate from the first and second die areas, and the first and second die areas are discrete chips.

7. The routing structure of claim 2, wherein the signal routing is formed on a same silicon layer as the first and second die areas, such that the signal routing, first die area, and second die area are part of a single chip.

8. The routing structure of claim 2, wherein the stacked signal line bundle includes a plurality of stacked trace lines.

9. The routing structure of claim 8, wherein at least one of the plurality of intra-layer switch regions comprises a signal line switching to a vacated reference line area.

10. The routing structure of claim 9, wherein a first plurality of the inter-layer switch regions comprise first vias characterized by approximately a same width as a minimum line width of the stacked reference lines the corresponding vias connect.

11. The routing structure of claim 8, wherein a second plurality of the inter-layer switch regions comprise second vias characterized by approximately a same width as a minimum line width of the stacked trace lines the corresponding vias connect.

12. The routing structure of claim 8, wherein each of the stacked trace lines is characterized by a corresponding thickness that is greater than a width.

13. The routing structure of claim 1, further comprising a capacitor adjacent the signal routing.

14. The routing structure of claim 1, further comprising a vacated track region of an uppermost metal layer directly underneath the one or more pads and over the stacked signal line bundle.

15. The routing structure of claim 1, wherein the stacked signal line bundle occupies an uppermost metal layer directly underneath the one or more pads.

16. The routing structure of claim 1, further comprising one or more reference lines in an uppermost metal layer directly underneath the one or more pads and over the stacked signal line bundle.

17. The routing structure of claim 1, wherein the signal routing is formed in a substrate that is separate from the first and second die areas, and the first and second die areas are discrete chips.

18. The routing structure of claim 1, wherein the signal routing is formed on a same silicon layer as the first and second die areas, such that the signal routing, first die area, and second die area are part of a single chip.

19. The routing structure of claim 1, wherein the stacked signal line bundle includes a plurality of stacked trace lines.

20. The routing structure of claim 19, wherein each of the stacked trace lines is characterized by a corresponding thickness that is greater than a width.

* * * * *